(12) United States Patent
Jung

(10) Patent No.: US 7,745,339 B2
(45) Date of Patent: Jun. 29, 2010

(54) METHOD FOR FORMING FINE PATTERN OF SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 530 days.

(21) Appl. No.: 11/672,676

(22) Filed: Feb. 8, 2007

(65) Prior Publication Data

US 2007/0202697 A1 Aug. 30, 2007

(30) Foreign Application Priority Data

Feb. 24, 2006 (KR) .................. 10-2006-0018144
Dec. 21, 2006 (KR) .................. 10-2006-0131936

(51) Int. Cl.
*H01L 21/302* (2006.01)
*H01L 21/461* (2006.01)

(52) U.S. Cl. ......................... 438/706; 257/E21.257

(58) Field of Classification Search ............. 438/706; 257/E21.257

See application file for complete search history.

(56) References Cited

U.S. PATENT DOCUMENTS

| | | | |
|---|---|---|---|
| 4,436,583 A | 3/1984 | Saiki et al. |
| 4,863,833 A | 9/1989 | Fukuyama et al. |
| 5,212,043 A | 5/1993 | Yamamoto et al. |
| 5,256,248 A | 10/1993 | Jun |
| 5,750,680 A | 5/1998 | Kim et al. |
| 6,051,678 A | 4/2000 | Kim et al. |
| 6,132,926 A | 10/2000 | Jung et al. |
| 6,225,020 B1 | 5/2001 | Jung et al. |
| 6,235,447 B1 | 5/2001 | Lee et al. |
| 6,235,448 B1 | 5/2001 | Lee et al. |

| | | |
|---|---|---|
| 6,716,761 B2 | 4/2004 | Mitsuiki |

FOREIGN PATENT DOCUMENTS

GB 2 345 286 A 7/2000

(Continued)

OTHER PUBLICATIONS

Jung, Jae Chang, U.S. Appl. No. 11/672,680, filed Feb. 8, 2007 for "Method for Forming Fine Pattern of Semiconductor Device."

*Primary Examiner*—David S Blum
(74) *Attorney, Agent, or Firm*—Townsend and Townsend and Crew LLP

(57) ABSTRACT

A method for forming a fine pattern of a semiconductor device comprises the steps of: forming a first hard mask pattern having a width of W1 and a thickness of T1 over an underlying layer formed over a semiconductor substrate; forming a second hard mask film with a planar type over the resulting structure and planarizing the second hard mask s to expose the first hard mask pattern; removing the first hard mask pattern by a thickness T2 from the top surface (0<T2<T1); performing a trimming process on the second hard mask film to form a second hard mask pattern having a slope side wall; performing a second trimming process on the second hard mask pattern to separate the second hard mask pattern from the first hard mask pattern and form a third hard mask pattern having a width of W2; and patterning the underlying layer using the first hard mask pattern and the third hard mask pattern as etching masks.

21 Claims, 5 Drawing Sheets

FOREIGN PATENT DOCUMENTS

| | | |
|---|---|---|
| JP | 54-155771 | 12/1979 |
| JP | 02-266517 | 10/1990 |
| JP | 2002319573 A | 10/2002 |
| JP | 2004-303870 A | 10/2004 |
| KR | 10-1993-0001301 | 1/1993 |
| KR | 10-2005-0052658 A | 6/2005 |
| KR | 100694412 B1 | 3/2007 |
| KR | 100744683 B1 | 7/2007 |
| WO | WO 96/37526 | 11/1996 |
| WO | WO 97/33198 | 9/1997 |

METHOD FOR FORMING FINE PATTERN OF SEMICONDUCTOR DEVICE

CROSS-REFERENCES TO RELATED APPLICATIONS

The present application claims priority to Korean patent application number 10-2006-0018144 and 10-2006-0131936, respectively filed on Feb. 24, 2006 and Dec. 21, 2006, which are incorporated by references in their entireties.

BACKGROUND OF THE INVENTION

The present invention relates to a method of manufacturing a semiconductor device, and more particularly, to a forming method of a hard mask pattern for obtaining fine pattern.

In order to manufacture semiconductor devices that have become smaller, the size of patterns has also become smaller. Research has been made to improve resist and photolithography equipment for obtaining fine patterns.

Although KrF (248 nm) or ArF (193 nm) as an exposure light source have been applied in photolithography, attempts have been made to use short wavelength light sources such as $F_2$ (157 nm) or EUV (13 nm).

However, when new light sources such as $F_2$ or EUV are applied, new exposer equipment is required, which results in increased manufacturing costs. Also, the increase of numerical apertures associated with the new light sources degrades the focus depth width.

Also, it is difficult to manufacture a highly-integrated semiconductor device having a fine pattern because the resolution of the pattern obtained from the exposer equipment using a short wavelength light source is limited to 0.1 μm.

SUMMARY OF THE INVENTION

Various embodiments of the present invention are directed at providing a method for forming a fine pattern on a semiconductor device which includes a double etching process on two kinds of hard mask films each having a different etch selectivity.

According to an embodiment of the present invention, a method for forming a fine pattern of a semiconductor device comprises the steps of: forming a first hard mask pattern having a width of W1 and a thickness of T1 over an underlying layer formed over a semiconductor substrate; forming a second hard mask film with a planar type over the resulting structure and planarizing the second hard mask s to expose the first hard mask pattern; removing the first hard mask pattern by a thickness T2 from the top surface (0<T2<T1); performing a trimming process on the second hard mask film to form a second hard mask pattern having a slope side wall; performing a second trimming process on the second hard mask pattern to separate the second hard mask pattern from the first hard mask pattern and form a third hard mask pattern having a width of W2; and patterning the underlying layer using the first hard mask pattern and the third hard mask pattern as etching masks.

In one embodiment, a method for forming a pattern of a semiconductor device includes forming a first hard mask pattern having a first width and a first thickness over an underlying layer formed over a semiconductor substrate. A second hard mask film is formed over the first hard mask pattern. The second hard mask film is removed at least until the first hard mask pattern is exposed. An upper portion of the exposed first mask pattern is removed, so that an upper surface of the resulting first hard mask pattern is provided to be lower than an upper surface of the second hard mask film. A first trimming process is performed on the second hard mask film to form a second hard mask pattern having a sloped sidewall. A second trimming process is performed on the second hard mask pattern to convert the second hard mask pattern into a third hard mask pattern having a second width, thereby forming the first and third hard mask patterns together on exposing portions of the underlying layer. The underlying layer is patterned using the first and third hard mask patterns as etching masks.

In another embodiment, a method for forming a pattern on a substrate includes forming a first hard mask pattern having first and second structures over an underlying layer, the first and second structures defining a first space and exposing a portion of the underlying layer. A second hard mask film is formed over the first hard mask pattern and within the first space, the underlying layer being substantially covered by the first hard mask pattern and the second hard mask film. The second hard mask film is removed to provide a third structure defined within the first space, the first and second structures of the first hard mask pattern being exposed. The third structure is etched to define a second space between the first structure and the third structure and a third space between the second structure and the third structure, the second space and the third space each exposing a portion of the underlying layer. The portions of the underlying layer exposed by the second space and third space are etched.

In another embodiment, the method further includes removing upper portions of the exposed first and second structures until the first and second structures have a lower height than the third structure. The third structure is etched until the third structure is provided with substantially the same thickness as the first structure. The underlying layer may be part of the substrate or a layer that is provided over the substrate.

In another embodiment, a method for forming a pattern for a substrate includes forming a first hard mask pattern having first and second structures over an underlying layer. The first and second structures define a first space and expose a portion of the substrate. A second hard mask film is formed over the first hard mask pattern and within the first space, the underlying layer being substantially covered by the first hard mask pattern and the second hard mask film. The second hard mask film is removed to provide a third structure defined within the first space, the first and second structures of the first hard mask pattern being exposed. The third structure is etched until the first, second, and third structures define a given pattern that exposes portions of the underlying layer. The underlying layer is etched to transfer the given pattern to the underlying layer.

In yet another embodiment, the method further includes removing upper portions of the exposed first and second structures until the first and second structures have a lower height than the third structure. The third structure is etched until the third structure is provided with substantially the same thickness as the first structure.

DETAILED DESCRIPTION OF THE SPECIFIC EMBODIMENT

The present invention will be described in detail with reference to the accompanying drawings.

Figure 1A:
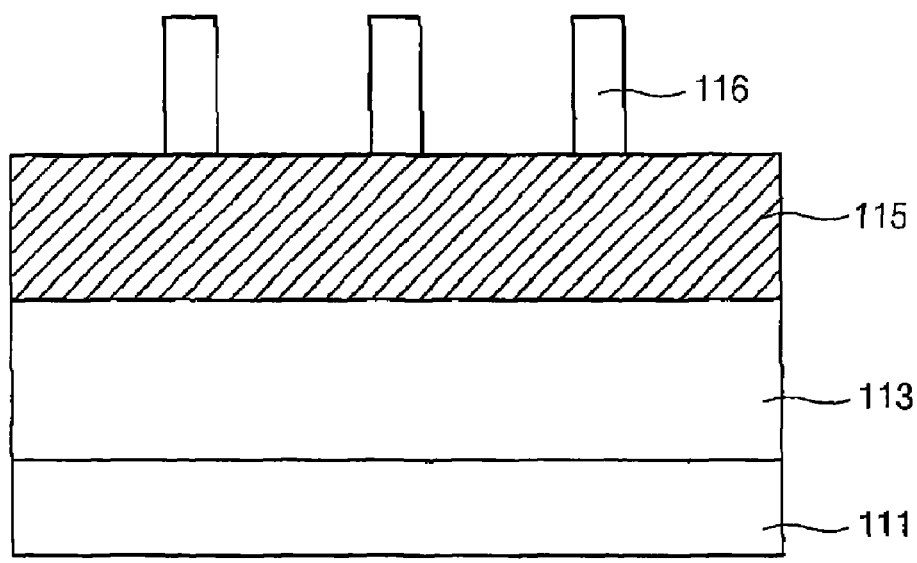
FIGS. 1a through 1i are cross-sections illustrating a method for forming a fine pattern of a semiconductor device according to an embodiment of the present invention.

FIG. 1a shows a first hard mask film 115 over an underlying layer 113 formed over a semiconductor substrate 111. A photoresist film is coated over the resulting structure. An exposure process is performed with an exposure mask positioned over the photoresist film. A developing process is performed to form a photoresist pattern 116. The underlying layer 113 is formed of a material used in a word line, a bit line, or a metal line. The first hard mask film 115 is formed from a material with an etch selectivity that is different than the etch selectivity of the underlying layer 113. The first hard mask film is formed from a group consisting of polysilicon, an oxide film, a nitride film, a metal and combinations thereof.

Figure 1B:
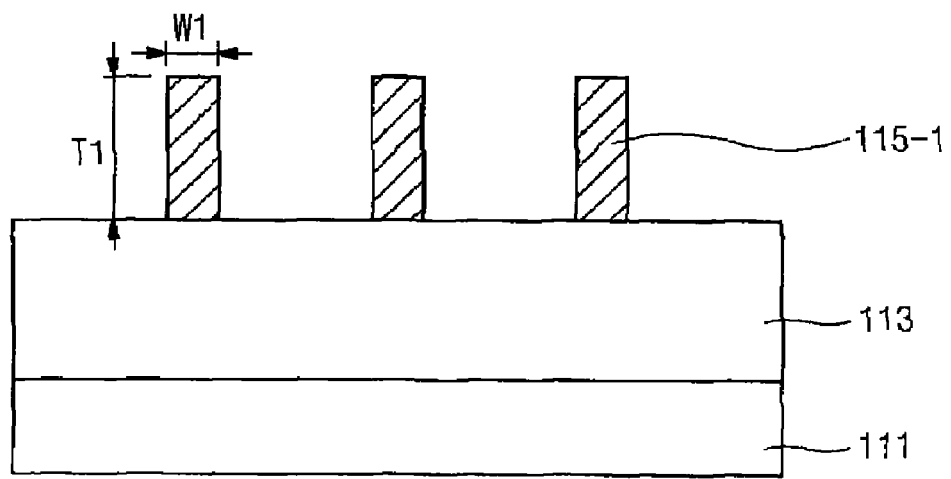

FIG. 1b shows the first hard mask film etched using the photoresist pattern as an etching mask to form a first hard mask pattern 115-1. The first hard mask pattern 115-1 has a width of W1 and a thickness of T1. The photoresist pattern is then removed.

In the exposure process for forming the photoresist pattern, a pattern may be designed to have the minimum line-width and the minimum pitch, and an over-exposure process for increasing exposure energy and exposure time is performed to expose the side surface of the photoresist film located in a shading region of the exposure mask. As a result, the photoresist pattern obtained after the developing process has a line-width of minimum size (W1) which has the smallest patternable pitch using conventional photolithography equipment, i.e., corresponds to the resolution limit of the equipment used.

Figure 1C:
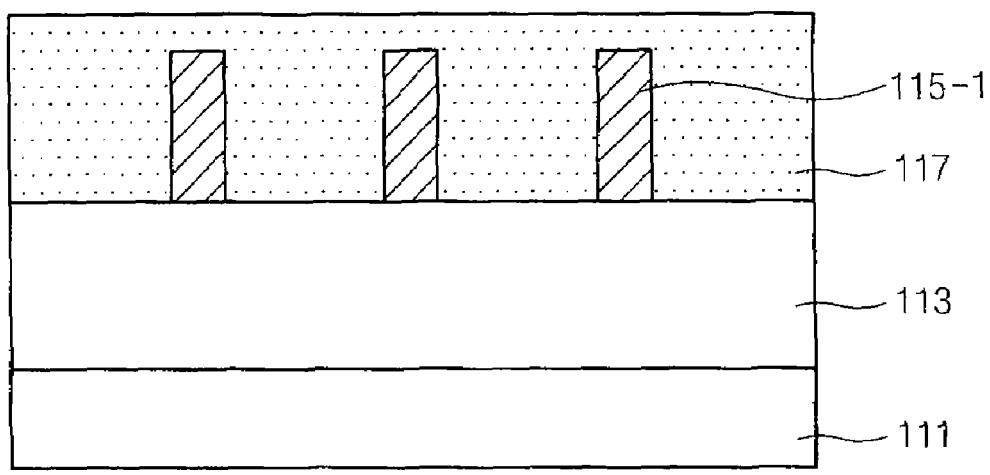

FIG. 1c shows a second hard mask film 117 formed over the resulting structure. The second hard mask film 117 is formed with a material having an etch selectivity that is different than the etch selectivity of the first hard mask film. The second hard mask film may be formed of an organic film or an inorganic film.

An organic film formed by a spin-coating process can be used. Generally, a photoresist film or an anti-reflection film can be used as the organic film. For example, the organic film has been disclosed in Korean Patent Publication Nos. 1984-0003145 and 1985-0008565, U.S. Pat. No. 5,212,043 (May 18, 1993), WO 97/33198 (Sep. 12, 1997), WO 96/37526 (Nov. 28, 1996), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,225,020 B1 (May 1, 2001), U.S. Pat. No. 6,235,448 B1 (May 22, 2001) and U.S. Pat. No. 6,235,447 B1 (May 22, 2001), which are incorporated by reference to the extent allowed.

Specifically, the photoresist film includes a base resin selected from a group consisting of a polyvinylphenol type, a polyhydroxystyrene type, a polynorbornene type, a polyadamantyl type, a polyimide type, a polyacrylate type, a polymethacrylate type, a polyfluorine type and a combination thereof. More specifically, the base resin of the photoresist film includes a polymer selected from the group consisting of; a ROMA-type polymer (including a Ring-Opened Maleic Anhydride repeating unit); COMA-type polymer (including a Cyclo-Olefin repeating unit, a Maleic Anhydride repeating unit and a methacrylate or acrylate repeating unit); and a hybrid-type polymer thereof. The anti-reflection film is formed of a resin selected from the group consisting of phenylamine resin, melamine derivative resin, alkali soluble resin, acrylate resin, epoxy resin, and combinations thereof.

The inorganic film may include an oxide film, a nitride film, or a polysilicon layer. Other types of films/layers may be used as the inorganic film according to application.

For example, when the first hard mask pattern is formed of a polysilicon layer, the second hard mask film is an organic film (e.g., a photoresist film).

Figure 1D:
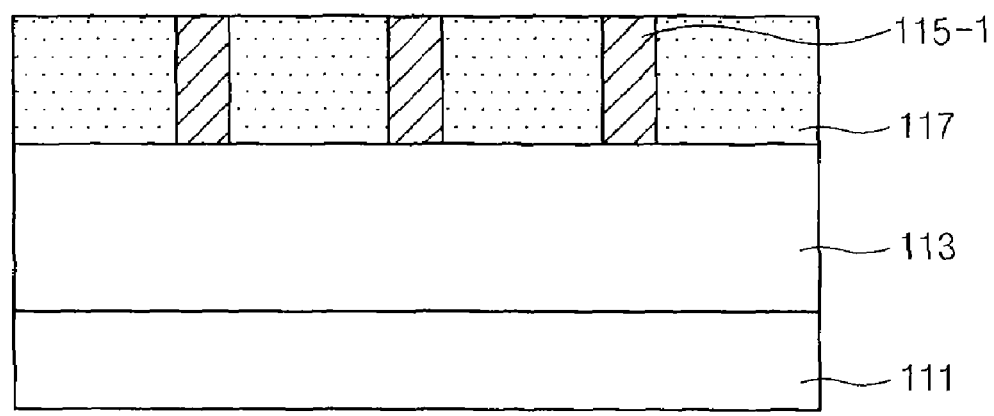

The second hard mask film 117 is planarized until the first hard mask pattern 115-1 is exposed as shown in FIG. 1d. The planarizing process may be performed by a CMP process or an etch-back process with an etching gas selected from the group consisting of $N_2$, $O_2$, Ar, H, Cl and combinations thereof.

Figure 1E:
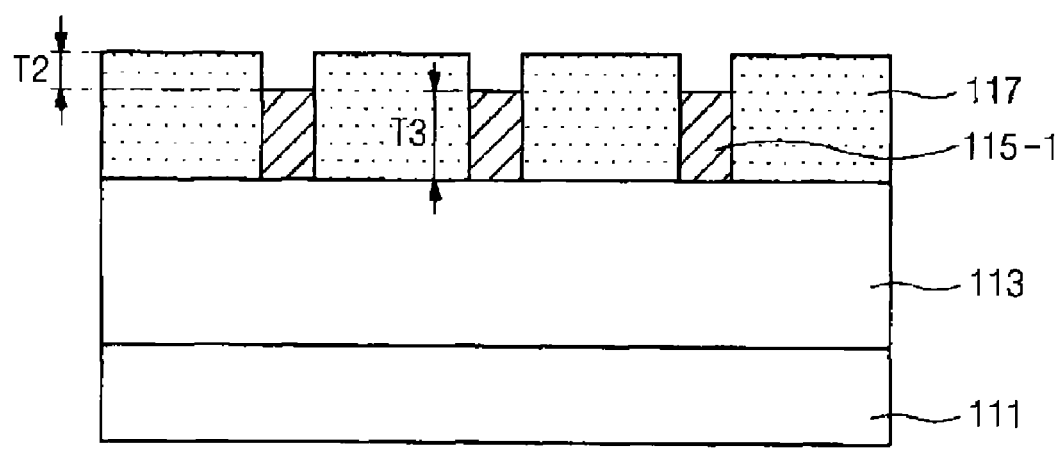

FIG. 1e shows the first hard mask pattern 115-1 removed to a given thickness (T2) from the top surface by the etch-back process, where T2 is $0<T2\leq\frac{1}{3}$ T1. The resulting first hard mask pattern has a thickness of T3 ($0<T3<T1$). The height of the first mask pattern 115-1 is reduced to be lower than that of the second hard mask film by using an over-etch method when an etch-back process is used.

The etch-back process is performed with an etching gas selected from the group consisting of $CF_4$, $Cl_2$, HBr and combinations thereof. For example, when the second hard mask film is an organic film and the first hard mask film is a polysilicon film, $CF_4$ is used as an etching gas.

Figure 1F:
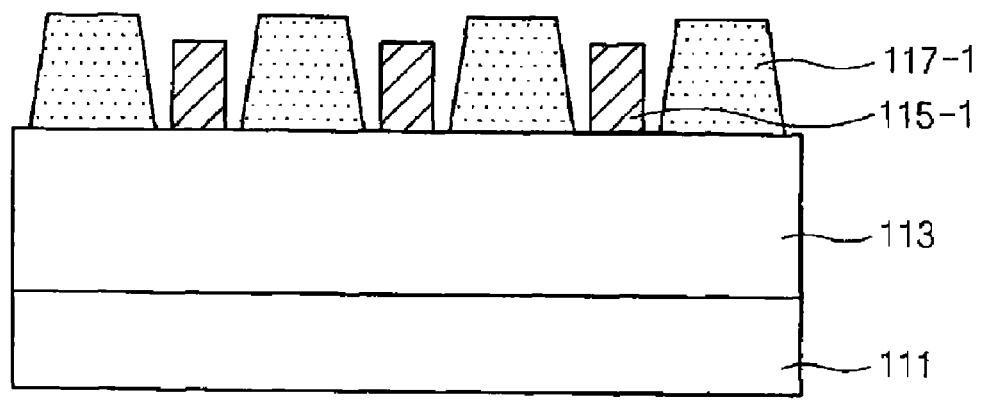

FIG. 1f shows a second hard mask pattern 117-1 having a sloped side wall obtained by performing a first trimming etching process on the resulting structure of FIG. 1e.

The first trimming process is performed under such a condition that the etch selectivity of second hard mask pattern: first hard mask pattern=9~10:1 using an etching gas selected from the group consisting of $CF_4$, $N_2$, $O_2$, Ar, H and combinations thereof. In the present implementation, the first trimming process is performed using an etching gas including $O_2$:$CF_4$:Ar=1:7~10:25~45 as main components.

For example, when the first hard mask pattern is a polysilicon layer, and the second hard mask film is an organic film and specifically a photoresist film, the first trimming process is performed under $O_2$ of 3~4 sccm, $CF_4$ of 30 sccm and Ar of 130 sccm.

The first trimming process (e.g., an etch-back process) is performed to etch the second hard mask film until the underlying layer is exposed. Portions of the underlying layers provided between the first and second hard mask patterns are exposed. Since the side surface of the second hard mask film is exposed by the etch-back process in the present implementation, the corner of the exposed second hard mask film is affected by the etching gas so that the side of the second hard mask pattern becomes a slope.

Figure 1G:
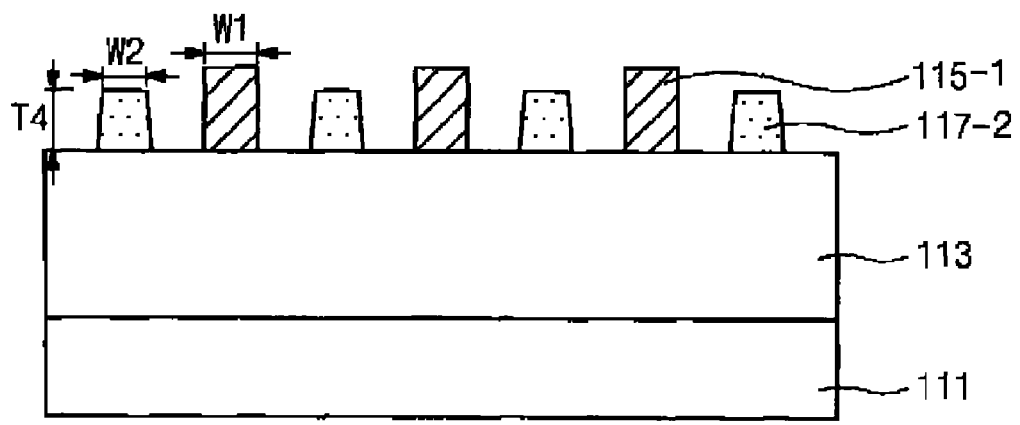

FIG. 1g shows the third hard mask pattern 117-2 having substantially the same width (w2) as that of the first hard mask pattern 115-1 obtained by a second trimming etching process.

The second trimming process is performed under such a condition that the etch selectivity of second hard mask pattern: first hard mask pattern=9~10:1 using an etching gas selected from the group consisting of $CF_4$, $N_2$, $O_2$, Ar, H and combinations thereof. In the present implementation, the second trimming process is performed with an etching gas including $O_2$:$CF_4$:Ar=1:40~80:25~50 as main components.

For example, when the first hard mask pattern is a polysilicon layer, and the second hard mask film is an organic film and specifically a photoresist film, the first trimming process is performed under $O_2$ of 1~2 sccm, $CF_4$ of 80 sccm and Ar of 50 sccm.

While the etching time of the second trimming process is adjusted, the width W2 of the third hard mask pattern 117-2 is substantially the same as W1 of the first hard mask pattern 115-1, and is formed apart from the first hard mask pattern at a given distance. The third hard mask pattern has the thickness of T4 ($0<T4<T3$).

Figure 1H:
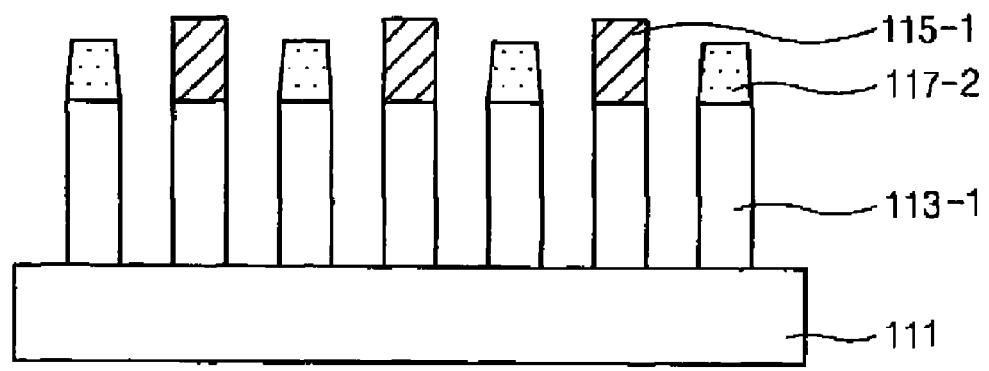

FIG. 1*h* shows the underlying layer pattern 113-1 obtained by a general etching process with the first and third hard mask patterns as etching masks.

Figure 1I:
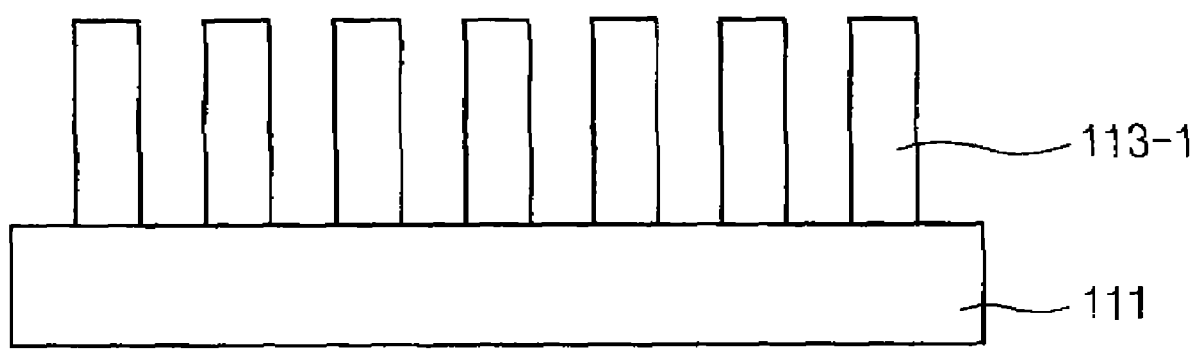

FIG. 1*i* shows an underlying pattern 113-1 obtained by performing a subsequent cleaning process on the resulting structure to remove the first hard mask pattern 115-1 and the third hard mask 117-2.

According to an embodiment of the present invention, the third hard mask pattern having a small pitch is formed between the first hard mask patterns by the double etching process including the first trimming process and the second trimming process. Therefore, when the underlying layer is etched using the first hard mask pattern and the third hard mask pattern as etching mask, a fine pattern is achieved that would otherwise cannot be obtained by a conventional lithography device.

Moreover, it is easy to secure the overlapping degree, the arrangement degree and the etching margin for etching process and it is possible to reduce the manufacturing cost and the process time of semiconductor devices.

The above embodiments of the present invention are illustrative and not limitative. For example, the terms "first hard mask film," "second hard mask film," "first hard mask pattern," "second hard mask pattern," and "third hard mask pattern" are used to describe the above embodiments. However, these are used for illustrative purposes. As will be appreciated by those skilled in the art, the present invention may be implemented using mask films (or mask patterns) that are not hard mask films (or hard mask patterns). Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a pattern of a semiconductor device, the method comprising:
   forming a first hard mask pattern having a first width and a first thickness over an underlying layer formed over a semiconductor substrate;
   forming a second hard mask film over the first mask pattern;
   removing the second hard mask film at least until the first hard mask pattern is exposed;
   removing an upper portion of the exposed first hard mask pattern, so that an upper surface of the resulting first hard mask pattern is provided to be lower than an upper surface of the second hard mask film;
   performing a first trimming process on the second hard mask film to form a second hard mask pattern having a sloped sidewall;
   performing a second trimming process on the second hard mask pattern to convert the second hard mask pattern into a third hard mask pattern having a second width, the first and third hard mask patterns together exposing portions of the underlying layer; and
   patterning the underlying layer using the first and third hard mask patterns as etching masks.

2. The method according to claim 1, wherein the patterned underlying is a word line, a bit line, or a metal line.

3. The method according to claim 1, wherein the first hard mask film includes one selected from the group consisting of polysilicon, an oxide film, a metal and combinations thereof.

4. The method according to claim 1, wherein the first width is a limit-resolution-size patternable by a lithography equipment used to form the pattern.

5. The method according to claim 1, wherein the first width of the first hard mask pattern is substantially the same as the second width of the third hard mask pattern.

6. The method according to claim 1, wherein the second hard mask film is formed with a material having an etch selectivity that is different than the etch selectivity of the first mask film.

7. The method according to claim 6, wherein the second mask film is an organic film or an inorganic film.

8. The method according to claim 7, wherein the organic film includes a photoresist film or an anti-reflection film, each of which is formed by a spin-coating process.

9. The method according to claim 8, wherein the organic film is a photoresist film, wherein a base resin of the photoresist film includes one selected from the group consisting of a polyvinylphenol type, a polyhydroxystyrene type, a polynorbornene type, a polyadamantyl type, a polyimide type, a polyacrylate type, a polymethacrylate type, a polyfluorine type and combinations thereof.

10. The method according to claim 8, wherein the organic film is an anti-reflection film, wherein the anti-reflection film is formed of a resin selected from the group consisting of phenylamine resin, melamine derivative resin, alkali soluble resin, acrylate resin, epoxy resin and combinations thereof.

11. The method according to claim 7, wherein the inorganic film includes a nitride film or a polysilicon layer.

12. The method according to claim 1, wherein the removing-the-first-mask-pattern step is performed with an etch gas selected from the group consisting of $CF_4$, $Cl_2$, HBr and combinations thereof.

13. The method according to claim 1, wherein the first trimming process is performed under such a condition that the etch selectivity of second mask pattern: first mask pattern=9~10:1, and
   wherein the first trimming process is performed using an etching gas selected from the group consisting of $CF_4$, $N_2$, $O_2$, Ar, H and combinations thereof.

14. The method according to claim 13, wherein the first trimming process is performed using an etching gas including $O_2$:$CF_4$:Ar=1:7~10:25~45 as components.

15. The method according to claim 1, wherein the second trimming process is performed under such a condition that the etch selectivity of second mask pattern: first mask pattern=9~10:1, and
   wherein the second trimming process is performed using an etching gas selected from the group consisting of $CF_4$, $N_2$, $O_2$, Ar, H and combinations thereof.

16. The method according to claim 15, wherein the second trimming process is performed using an etching gas including $O_2$:$CF_4$:Ar=1:40~80:25~50 as main components.

17. A method for forming a pattern for a substrate, the method comprising:
   forming a first hard mask pattern having first and second structures over an underlying layer, the first and second structures defining a first space and exposing a portion of the underlying layer;
   forming a second hard mask film over the first hard mask pattern and within the first space, the underlying layer being substantially covered by the first hard mask pattern and the second mask film;
   removing the second hard mask film to provide a third structure defined within the first space, the first and second structures of the first hard mask pattern being exposed;

removing an upper portion of the exposed first hard mask pattern such that an upper surface of the first hard mask pattern is lower than an upper surface of the second hard mask pattern;

etching the third structure to define a second space between the first structure and the third structure and a third space between the second structure and the third structure, the second space and the third space each exposing a portion of the underlying layer; and etching the portions of the underlying layer exposed by the second space and third space.

18. The method of claim 17, further comprising:

removing upper portions of the exposed first and second structures until the first and second structures have a lower height than the third structure, wherein the third structure is etched until the third structure is provided with substantially the same thickness as the first structure, wherein the underlying layer is provided over the substrate.

19. The method of claim 17, wherein the underlying layer is part of the substrate.

20. A method for forming a pattern for a substrate, the method comprising:

forming a first hard mask pattern having first and second structures over an underlying layer, the first and second structures defining a first space and exposing a portion of the underlying layer;

forming a second hard mask film over the first hard mask pattern and within the first space, the underlying layer being substantially covered by the first hard mask pattern and the second mask film;

removing the second hard mask film to provide a third structure defined within the first space, the first and second structures of the first hard mask pattern being exposed;

removing an upper portion of the exposed first hard mask pattern such that an upper surface of the first hard mask pattern is lower than an upper surface of the second hard mask pattern;

etching the third structure until the first, second, and third structures define a given pattern that exposes portions of the underlying layer; and etching the underlying layer to transfer the given pattern to the underlying layer.

21. The method of claim 20, further comprising:

removing upper portions of the exposed first and second structures until the first and second structures have a lower height than the third structure, wherein the third structure is etched until the third structure is provided with substantially the same thickness as the first structure, wherein the underlying layer is provided over the substrate.

* * * * *